United States Patent [19]
Adam

[11] 4,288,863
[45] Sep. 8, 1981

[54] PROGRAMMABLE SEMICONDUCTOR MEMORY CELL

[75] Inventor: Fritz G. Adam, Freiburg, Fed. Rep. of Germany

[73] Assignee: ITT Industries, Inc., New York, N.Y.

[21] Appl. No.: 132,587

[22] Filed: Mar. 21, 1980

[30] Foreign Application Priority Data

Apr. 26, 1979 [DE] Fed. Rep. of Germany ....... 2916884

[51] Int. Cl.³ ............................................. G11C 11/40
[52] U.S. Cl. .................................. 365/182; 365/104; 365/105; 365/149; 365/175; 365/218; 307/238.8
[58] Field of Search ............... 365/149, 103, 104, 105, 365/175, 182, 218; 307/238

[56] References Cited

U.S. PATENT DOCUMENTS

4,004,159 1/1977 Rai ...................................... 307/238
4,115,914 9/1978 Harari .................................... 29/571

Primary Examiner—Terrell W. Fears
Attorney, Agent, or Firm—John T. O'Halloran; Thomas N. Twomey

[57] ABSTRACT

A programmable non-volatile semiconductor memory cell consisting of an n-channel insulated gate field effect transistor comprising a gate electrode which is floating with respect to potential, and enclosed on all sides by an insulating material and which, in its surface expansion, extends with electrode parts beyond a channel region of the insulated gate field effect transistor, which channel region is arranged on a surface of a monocrystalline semiconductor substrate, and which gate electrode is coupled capacitively by means of two electrode parts of different size via an insulated gate, to respective programming electrodes wherein an erase electrode to which an erase signal is capable of being applied, is created by a first planar zone forming a pn-junction with the semiconductor substrate and which, together with a first electrode part of the gate electrode, forms a first capacitance which is substantially smaller than a second capacitance between a second electrode part and a write electrode to which a write signal is capable of being applied, and wherein between the first planar zone and a first surface portion of said gate electrode there is arranged an insulating layer which is genetically grown on the free surface of said first planar zone and has a thickness ranging between 100 and 300 angstrom units and which forms a tunnel junction at a sufficiently high existing field strength, between said first planar zone and said first surface portion of the gate electrode so that the recharging of said gate electrode is effected by tunnel currents.

12 Claims, 14 Drawing Figures

PROGRAMMABLE SEMICONDUCTOR MEMORY CELL

BACKGROUND OF THE INVENTION

The invention relates to a programmable non-volatile semiconductor memory cell of the type having an n-channel insulated gate field effect transistor comprising a gate electrode which is floating with respect to potential, is enclosed on all sides by an insulating material and which on its surface has electrodes which extend beyond the channel region of the insulated gate field effect transistor which channel region is arranged at the surface of a monocrystalline semiconductor substrate and which gate electrode is coupled capacitively by means of two electrode parts of different size via an insulated gate to respective programming electrodes, as known from the "1978 IEEE International Solid-State Circuits Conference, Digest of Technical Papers" (February, 1978), pp. 196 and 197. In this semiconductor memory cell there are provided two programming electrodes which, with the gate electrode which is floating with respect to potential, and consists of polycrystalline silicon, form two differently large capacitances, and with the dielectric thereof consisting of silicon oxide thermally grown on the gate elctrode, as may be concluded from the publication in conjunction with FIG. 2 thereof, in which erase characteristics relating to silicon oxides grown on monocrystalline and on polycrystalline silicon for serving as the dielectric for the capacitances, are confronted with one another. From FIG. 3 is results that the silicon oxide dielectric as grown on polycrystalline material have several times lower erase voltages than the one grown on monocrystalline silicon. This is deemed to be due to increased electric fields in the vicinity of the silicon grain borders.

OBJECTIVE OF THE INVENTION

With the conventional type of memory cell $10^4$ switching cycles have been performed experimentally before causing negligible damage. It is the object of the invention to increase this number of switching cycles which has caused noticeable damages to the dielectric penetrated by the charge carriers.

SUMMARY OF THE INVENTION

The invention is based on the idea of using, in distinction to the conventional memory cell, a dielectric of a silicon oxide layer grown genetically on a monocrystalline semiconductor material, so that it will be possible to obtain substantially thinner and more uniformly grown dielectric materials.

Preferably, the dielectric for the first capacitance (Ce) is an insulating layer of $SiO_2$ genetically gorwn on a silicon substrate. For practical reasons, with most of the types of embodiment to be described hereinafter, relating to programmable semiconductor memory cells according to the invention, the material for the dielectric layer of the second capacitance Cw is made of the same material as the dielectric of the first capacitance. During a simultaneous manufacture on the monocrystalline silicon substrate the two capacitances will then have the same insulating layer thicknesses.

Calculations have shown that optimum programming times are obtainable when the second capacitance Cw between the write electrode and the gate electrode is at least four times as large as the first capacitance Ce between the erase electrode and the gate electrode.

The gate electrode may consist of an n-doped polysilicon or of any metal so that evaporation and etching processes can be used which are customary in manufacture.

BRIEF DESCRIPTION OF THE DRAWINGS

The invention and types of embodiments will now be explained with reference to FIGS. 1 to 14 of the accompanying drawings, in which.

DESCRIPTION OF THE PREFERRED EMBODIMENTS

Figure 1:
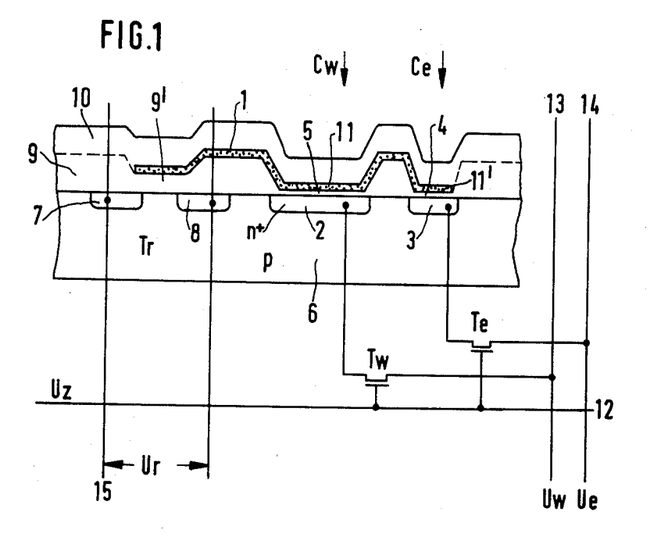
FIG. 1, is a partly sectional view taken vertically in relation to the surface side of a semiconductor wafer, showing a first example of embodiment relating to the semiconductor memory cell according to the invention.
Figure 2:
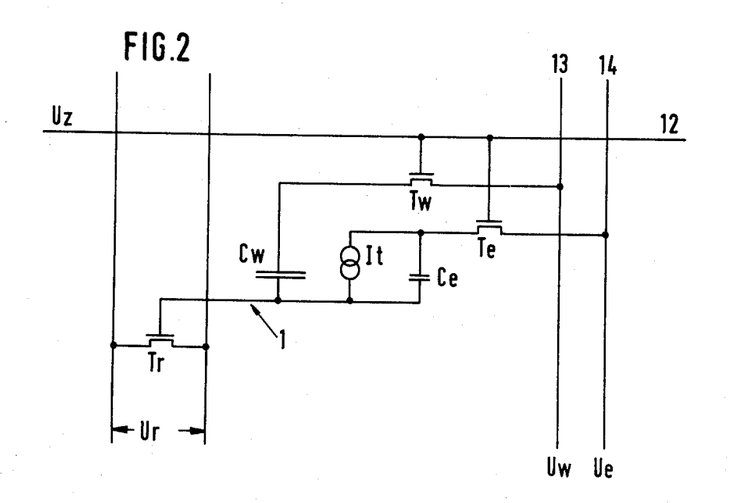
FIG. 2 shows the equivalent circuit diagram relating to the first example of embodiment of the semiconductor memory cell according to the invention as shown in FIG. 1, FIG. 3, in a top view, shows a topological layout of the memory cell according to FIGS. 1 and 2, in an aluminum-gate design as parts of a storage matrix, FIGS. 4 and 5 (FIG. 5 in Si-gate design) in a partly sectional or top view, respectively, shows a second type of embodiment of the semiconductor memory cell according to the invention, FIGS. 6 and 7 (FIG. 7 in Si-gate design) in the same representations, shows a third type of embodiment of the semiconductor memory cell according to the invention.
Figure 3:
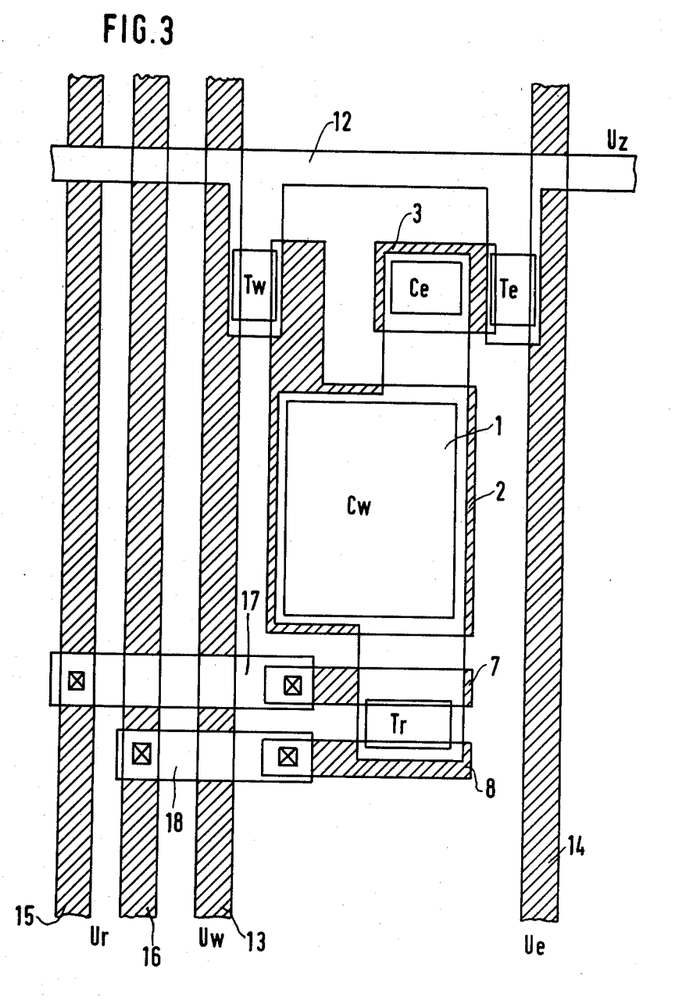

The first type of embodiment of the semiconductor memory cell according to the invention as shown in FIGS. 1 to 3 includes a source zone 7 and a drain zone 8 of a read transistor Tr, on one surface side of a semiconductor substrate 6, as well as a first planar zone 3 and a second planar zone 2 produced by a conventional planar diffusion process. Subsequently thereto, the gate electrode 1 is deposited onto a lower insulating partial layer 9 of graduated thickness. The gate electrode 1, being within the area between the source zone 7 and the drain zone 8 of the read transistor, and controlling in the usual way the channel current.

However, the gate electrode, within the area of the second planar zone 2, contains a second electrode part 11 and, within the area of the first planar zone 3, a first electrode part 11'. Below the second electrode part 11 the dielectric layer 5 togather with the second planar zone 2 forms the second capacitance Cw, while the first capacitance Ce is formed by the first electrode part 11' and the first planar zone 3 on both sides of a genetically grown insulating layer 4. As is illustrated in FIG. 1, and also in the further FIGS. 4, 6 and 8, the thickness of the genetically grown insulating layer 4 is substantially smaller than that of the other insulating layer parts and that of the gate insulating layer 9' of the read transistor Tr.

The grown insulating layer 4 is chosen to have a thickness ranging between 100 and 300 angstrom units, so that a tunnel junction will result when a sufficiently high field strength exists in the insulating layer. The recharging of the gate electrode 1 is effected with the aid of tunnel currents at a certain sufficiently high voltage applied to the tunnel junction.

In the case of a semiconductor substrate 6 consisting of silicon, the insulating layer 4 can be produced genetically by way of a purely thermal oxidation within an atmosphere containing oxygen. This is not the case when using an insulating layer 4 consisting of $Si_3N_4$. In this case, an additional activating energy must be produced by way of glow discharge.

The state of charge of the gate electrode 1 and, consequently, the stroed information is interrogated via the source zone 7 and the drain zone 8 of the read transistor Tr, to which zones the read voltage Ur is applied.

The second planar zone 2 is connected via the source-drain section of the write transistor Tw to the write line 13, while the first planar zone 3 is applied via the source-drain section of the erase transistor Te, to the erase line 14. The gate electrode of the write transistor Tw and that of the erase transistor Te are both connected to the row decoding line Uz.

FIG. 2 shows the equivalent circuit diagram relating to the semiconductor memory cell according to the invention as shown in FIG. 1 with identical parts being indicated by the same references numerals. Additionally, in FIG. 2 the reference It indicates the current source associated with the tunnel current. The following applies to the tunnel current $$It = I_0 \cdot \exp(E_{Ce}/E_O)$$

wherein $E_{Ce}$ is the field strength in the dielectric of the first capacitance Ce and $E_O$ is a characteristic field strength constant.

FIG. 3 in a top view on to a plate-shaped silicon substrate body, shows a topological layout of the semiconductor memory cell according to FIG. 1, employing the same reference numerals, in an aluminum-gate design. In this drawing, the zones which are not covered by electrode parts or conductor parts, are shaded.

From this it is apparent that the row decoding line 12 is realized in the form of a conducting pattern deposited onto the top insulating partial layer 10. Preferably, this conducting pattern is produced from a uniform aluminum layer in the conventional way by employing photolithographic methods. The write line 13 and the erase line 14, however, are diffused just like the source line 15 and the drain line 16, in a strip-shaped manner by employing a planar diffusion process—preferably together with the source zone 7 and the drain zone 8—into the common main surface of the semiconductor substrate. The interconnection between the source zone 7 and the source line 15, however, is again realized by the conducting pattern 17, and the interconnection between the drain line 16 and the drain zone 8 is realized by the conducting pattern 18. The gate electrode 1 together with the second planar zone 2 forms the capacitance Cw, and with the first planar zone 3, the capacitance Ce.

Figure 4:
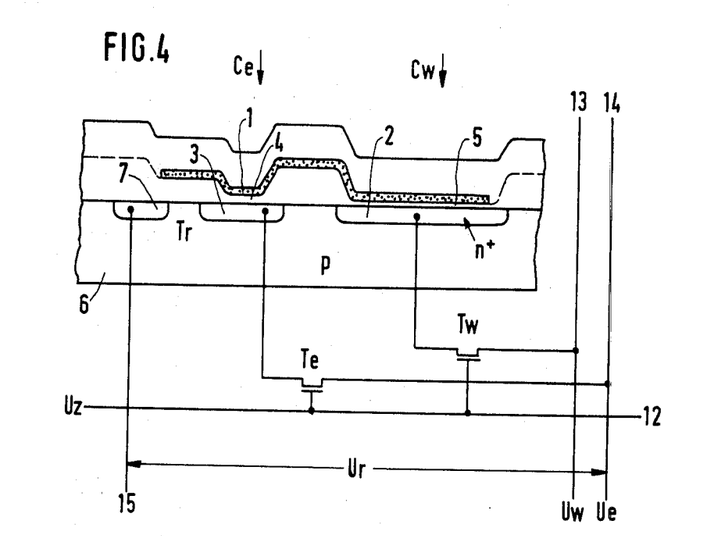
Figure 5:
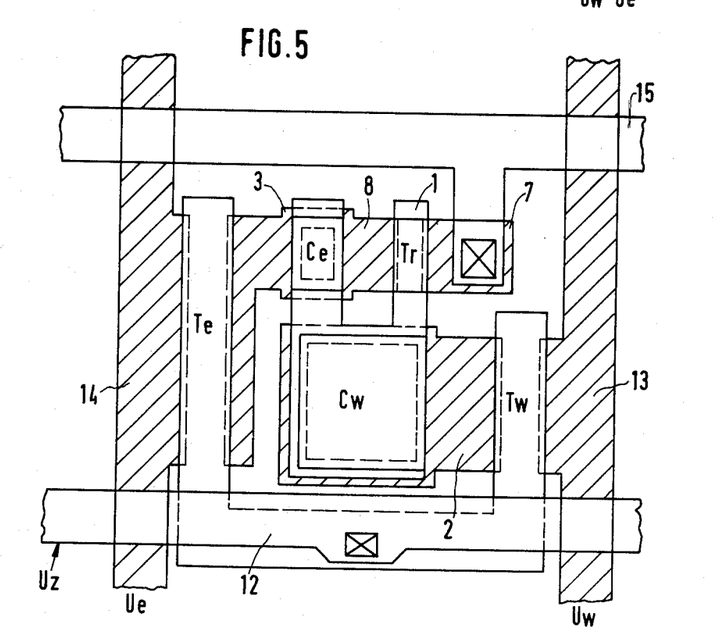

The basic idea underlying further types of embodiment of a semiconductor memory cell according to the invention is to design the first planar zone 3 to extend contiguously with either the source zone 7 or the drain zone 8, as will not be explained with reference to FIGS. 4 and 5. FIG. 4, in the same way as FIG. 1, schematically shows part of such a memory cell according to the invention, while FIG. 5 shows the top view on to the topological layout of this memory cell according to the invention in a silicon-gate design. Accordingly the first planar zone 3, when designed accordingly, takes over the function of the drain zone 8 and, according to FIG. 5, is designed L-shaped and extends contiguously with the drain zone 8. Again those parts of the zones which are not covered by the conducting patterns or electrode parts, are shaded. Accordingly, it can be recognized from FIG. 5 that, in distinction to the example of embodiment shown in FIG. 3, the source line 15 is designed in this case to have the shape of a conducting pattern. Moreover, FIG. 5 shows that again the erase line 14 and the source line 15 have been realized to have the shape of diffused conducting zones.

Figure 6:
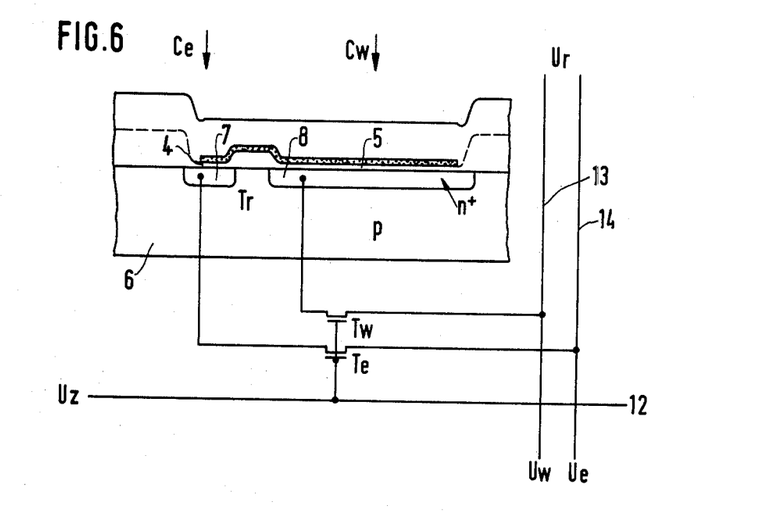
Figure 7:
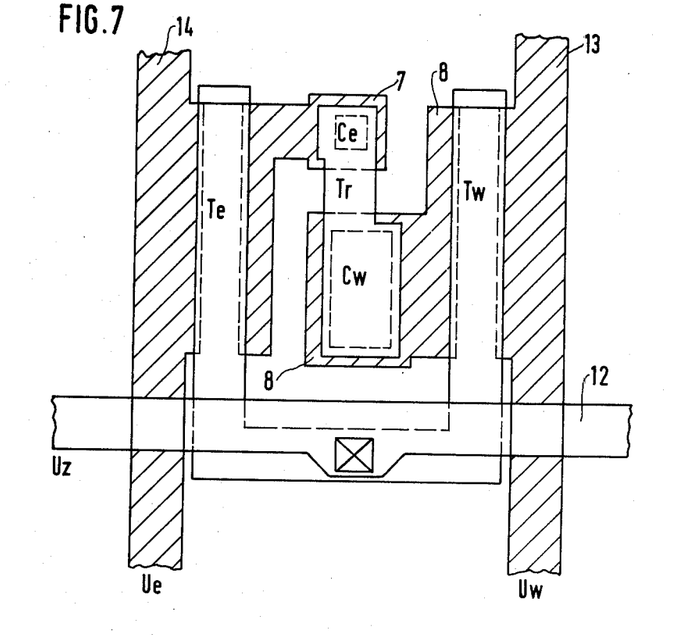

A further saving in space is provided by the type of embodiment of the semiconductor memory cell according to the invention as shown in FIGS. 6 and 7. In the same representation as that of FIGS. 1 and 4, FIG. 6 shows a sectional view, and FIG. 7 a top view on to the topological layout in Si-gate design. The type of embodiment shown in FIGS. 6 and 7 differs from that shown in FIGS. 4 and 5 in that the first planar zone is designed to extend contiguously with the source zone 7 and also the second planar zone is designed to extend contiguously with the drain zone 8. Considering that the previous examples of embodiment have been thoroughly explained, FIG. 6 and 7 are not in need of any special explanation. Here, too, the zone parts not covered by electrode parts and parts of the conducting pattern, are shaded.

Figure 8:
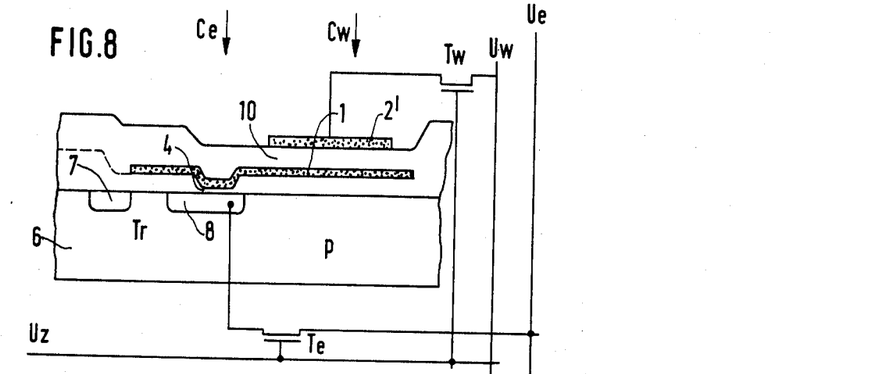
FIG. 8 shows a fourth type of embodiment of the semiconductor memory cell according to the invention.

Considering that the dielectric of the second capacitance Cw is not subjected to any additional requirements concerning the tunnelling of charge carriers, the write electrode may also be designed to have the shape of a conducting layer 2' of highly n-doped polysilicon or even of a metal on an insulating layer 10 above the second surface part of the gate electrode 1. Such a type of embodiment is illustrated in FIG. 8. A top view has been omitted in this case, because the topological layout is made in the same way as already described.

In the semiconductor memory cell according to the invention the planar zones 2 and 3 should overlap the edges of the parts of the electrode parts which are effective as capacitances Ce and Cw, in order to avoid unwanted effects. This principle should be applied at least to the first planar zone 3 forming the first capacitance Ce, because in this case there must be realized a uniform tunnel junction.

Figure 9:
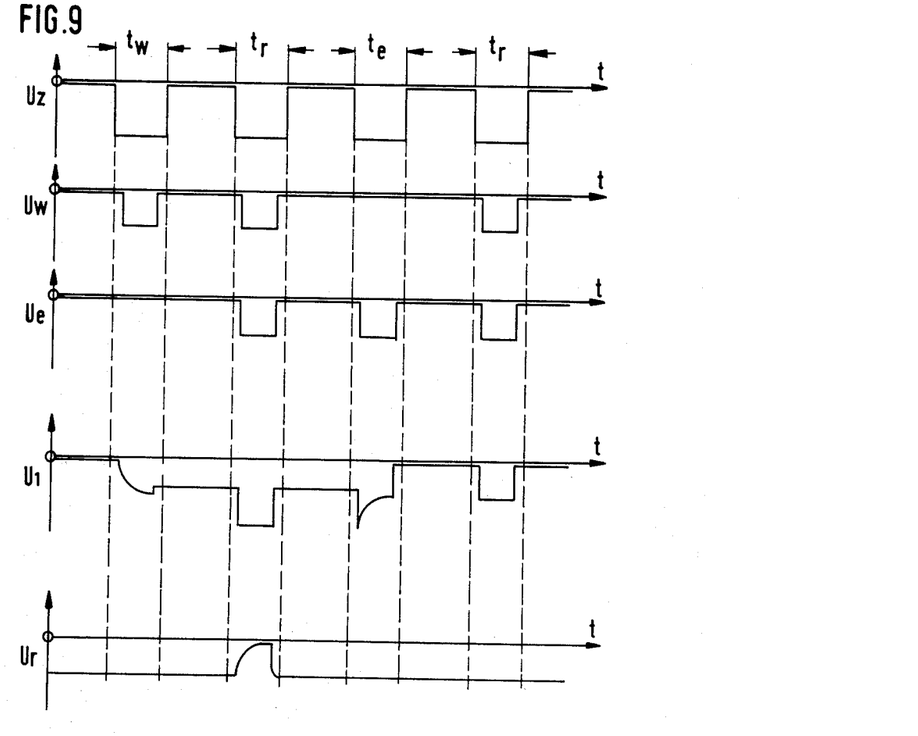
FIG. 9 shows the potential variations of the voltages stated on the ordinate side, as given in FIGS. 1 to 5 and 8.

FIG. 9 serves to illustrate the potentials or the voltages required for writing, reading or erasing, plotted as a function of the time 5 during one write interval $t_w$, two read intervals $t_r$ and the erase interval $t_e$. U1 shows the potential of the gate electrode 1 and Ur shows the read voltage relating to the types of embodiment as shown in FIGS. 1 to 5 and 8. In the type of embodiment according to FIGS. 6 and 7, however, during the read interval $t_r$, the potential Ue is switched across a load resistor, to reference potential. Uz indicates the row decoding potential, Uw indicates the write potential, and Ue indicates the erase potential.

Figure 10:
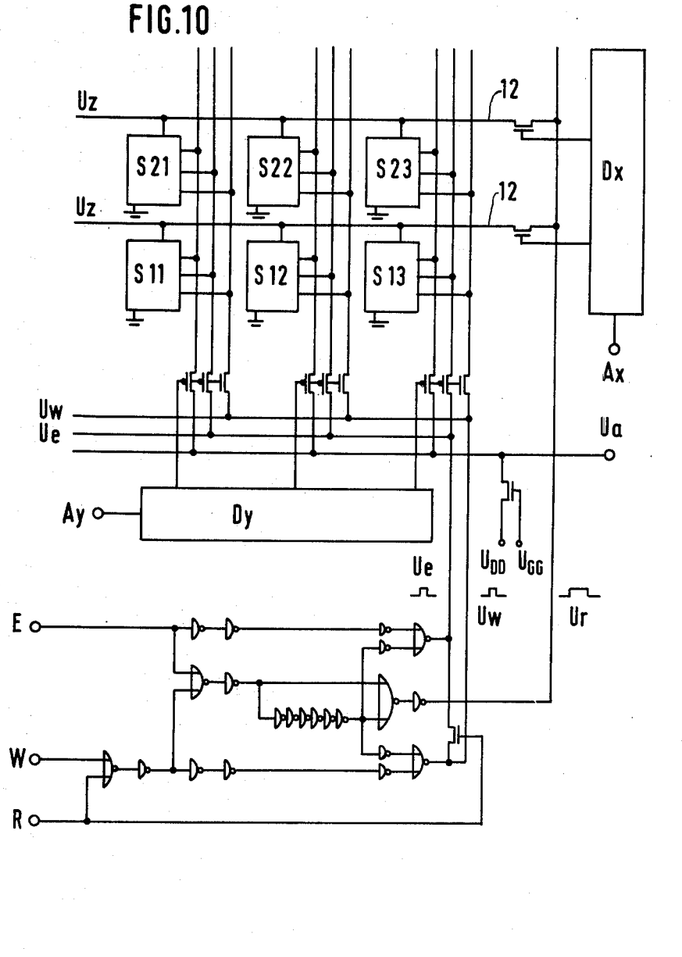
FIG. 10 shows the basic circuit diagram of a bitwisely erasable storage matrix comprising 6 semiconductor memory cells according to the invention, and FIGS. 11 to 14, in an energy-band diagram, show potential profiles of the kind assumed to exist during or after the writing or erasing respectively.

FIG. 10 shows the block diagram relating to a bitwisely erasable storage matrix comprising 6 semiconductor memory cells according to the invention including the decoding part with the column decoding part Dy and the row decoding part Dx, as well as the programming circuit. Since neither the decoding part nor the programming circuit are germane to the subject matter of the invention, these will only be described briefly herein. The programming circuit, moreover, contains an input E for effecting the input of the erase signal, an input W for effecting the input of the write signal, and an input R for effecting the input of the read signal. According to the input signals, the erase voltage Ue, the write voltage Uw or the read voltage Ur will appear at the three outputs of the programming circuit respectively, and are then applied to the correspondingly designated terminals of the semiconductor memory cells as shown in the drawings of the examples of embodiment according to the invention.

Ay indicates the input of the column decoding part Dy which serves the input of the encoded column address signal. Accordingly, Ax indicates the input of the row decoding part to which there is applied the encoded row address signal.

Each of the memory cells comprises a fifth output which, according to FIG. 10, is applied to ground. To this fifth output it is possible to connect all source zones 7 of all semiconductor memory cells. The ground potential may also be replaced by any other fixed reference potential.

Figure 11:
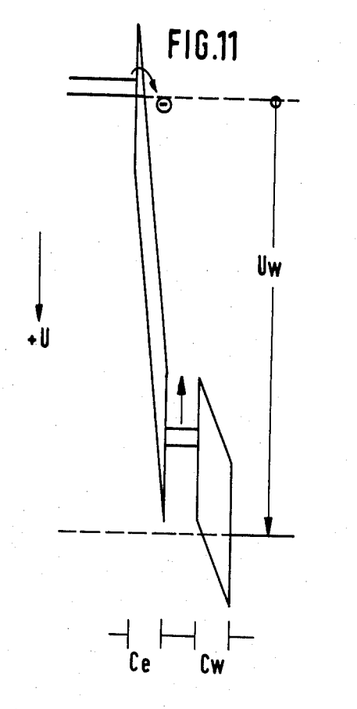
Figure 12:
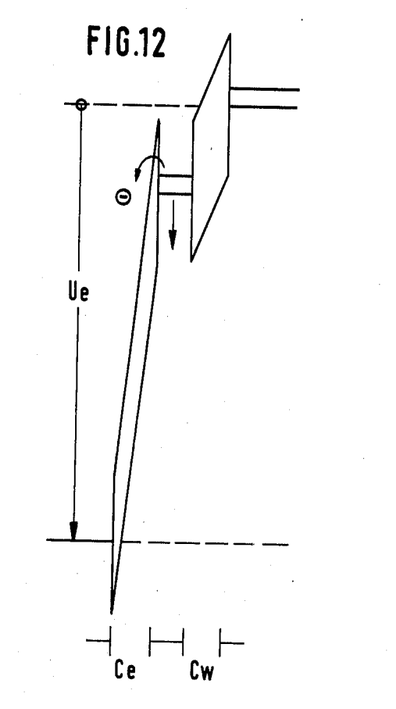
Figure 13:
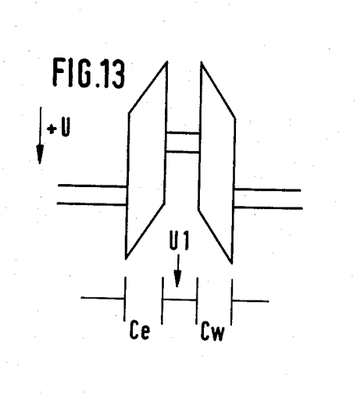

FIGS. 11 to 14 illustrate, with reference to the energy band diagram, and within the area of the gate electrode 1 the potential relationships either during or after the erase or writing respectively. FIG. 11 shows the conditions shortly after the application of the write potential Uw. The arrow indicates the potential variation during the charging of the gate electrode. The state after the writing, is shown in FIG. 13.

Figure 14:
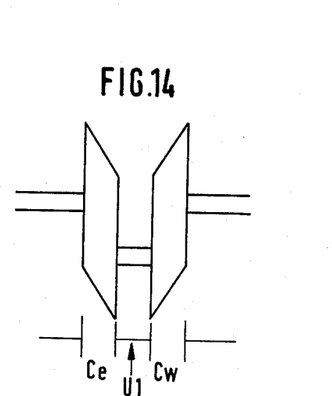

FIG. 12, however, illustrates by the arrow the potential variation of the gate electrode 1 shortly after the application of the erase signal Ue. Subsequently to the erase there will result over the gate electrode and the adjacent insulating layers, potential relationships as shown in FIG. 14.

I claim:

1. A programmable non-volatile semiconductor memory cell consisting of an n-channel insulated gate field effect transistor comprising a gate electrode which is floating with respect to potential, and enclosed on all sides by an insulating material and which, in its surface expansion, extends with electrode parts beyond a channel region of the insulated gate field effect transistor, which channel region is arranged on a surface of a monocrystalline semiconductor substrate, and which gate electrode is coupled capacitively by means of two electrode parts of different size via an insulated gate, to respective programming electrodes wherein:

an erase electrode to which an erase signal is capable of being applied, is created by a first planar zone forming a pn-junction with the semiconductor substrate, and which, together with a first electrode part of the gate electrode forms a first capacitance which is substantially smaller than a second capacitance between a second electrode part and a write electrode to which a write signal is capable of being applied, and wherein between said first planar zone and a first surface portion of said gate electrode there is arranged an insulating layer which is genetically grown on the free surface of said first planar zone and has a thickness ranging between 100 and 300 angstrom units and which forms a tunnel junction at a sufficiently high existing field strength, between said first planar zone and said first surface portion of the gate electrode so that the recharging of said gate electrode is effected by tunnel currents.

2. A semiconductor memory cell as claimed in claim 1, wherein said genetically grown insulating layer consists of $SiO_2$.

3. A semiconductor memory cell as claimed in claims 1 or 2, wherein said second capacitance between said write electrode and said gate electrode is at least four times as large as said first capacitance between said erase electrode and said gate electrode.

4. A semiconductor memory cell as claimed in claim 1 or 2, the dielectric layer of said second capacitance consists chemically of the same material as the genetically grown insulating layer of said first capacitance, and that said insulating layers are of equal thickness.

5. A semiconductor memory cell as claimed in claim 1 or 2 wherein said gate electrode consists either of a heavily n-doped polysilicon or of metal.

6. A semiconductor memory cell as claimed in claim 1 or 2, wherein said write electrode is designed to have the shape of a conducting layer consisting either of a heavily n-doped polysilicon or of a metal, with said conducting layer being arranged on an insulating layer above said second surface part of the gate electrode.

7. A semiconductor memory cell as claimed in claim 1, wherein said write electrode is designed to have the shape of a second planar zone forming a pn-junction with said semiconductor substrate.

8. A semiconductor memory cell as claimed in claim 7 wherein said second planar zone is designed to extend contiguously with the source zone or the drain zone.

9. A semiconductor memory cell as claimed in claim 7, wherein said first planar zone is designed to extend contiguously with said source zone or said drain zone.

10. A semiconductor memory cell as claimed in claim 7, wherein one of said planar zones is designed to extend contiguously with said source zone and that the other one of said planar zones is designed to extend contiguously with said drain zone.

11. A semiconductor memory cell as claimed in claim 10 wherein said planar zones overlap the edges of the portions of the electrode parts which are effective as capacitances.

12. A semiconductor memory cell as claimed in claim 11 wherein the write signal is applied to the write electrode via the source-drain section of a write transistor designed as an insulated gate field effect transistor, and that the erase signal is applied to the erase electrode via the source-drain section of an erase transistor designed as an insulated gate field effect transistor, and that the gate electrodes of both said write transistor and said erase transistor are connected to a row decoding line which is used as a word line.

* * * * *